US005465046A

United States Patent [19]
Campbell et al.

[11] Patent Number: 5,465,046
[45] Date of Patent: Nov. 7, 1995

[54] MAGNETIC FORCE MICROSCOPY METHOD AND APPARATUS TO DETECT AND IMAGE CURRENTS IN INTEGRATED CIRCUITS

[76] Inventors: Ann. N. Campbell, 13170-B Central SE Richard E. Anderson, 2800 Tennessee NE, Albuquerque, N.M. 87110; Edward I. Cole, Jr., 2116 White Cloud NE, Albuquerque, N.M. 87112

[21] Appl. No.: 215,431

[22] Filed: Mar. 21, 1994

[51] Int. Cl.$^6$ .................................................. G01R 33/02
[52] U.S. Cl. ..................... 324/244; 324/260; 324/754; 324/751
[58] Field of Search ....................... 324/244, 260, 324/754, 751; 250/306; 73/105

[56] References Cited

U.S. PATENT DOCUMENTS

| | | | |
|---|---|---|---|
| 5,266,897 | 11/1993 | Watanuki et al. | 324/244 |
| 5,315,247 | 5/1994 | Kaiser et al. | 324/244 |

OTHER PUBLICATIONS

D. Rugar et al., "Atomic Force Microscopy," *Physics Today*, Oct. 1990, pp. 23–30.
P. Grütter et al., "Batch Fabricated Sensors For Magnetic Force Microscopy," *Applied Physics Letters*, vol. 57, No. 17, Oct. 22, 1990, pp. 1820–1822.
T. Göddenhenrich et al., "Probe Calibration In Magnetic Force Microscopy," *Applied Physics Letters, vol. 57, No. 24, Dec. 10, 1990, pp. 2612–2614*.
T. Albrecht et al., "Frequency Modulation Detection Using High–Q Cantilevers For Enhanced Force Microscope Sensitivity," *Journal of Applied Physics*, vol. 69, No. 2, Jan. 15, 1991, pp. 668–673.
P. Grütter et al., "Magnetic Force Microscopy With Batch-Fabricated Force Sensors," *Journals of Applied Physics*, vol. 69, No. 8, Apr. 15, 1991, pp. 5883–5885.
K. Helmreich et al., "An Approach To Chip–Internal Current Monitoring and Measurement Using an Electron Beam Tester," *Proceedings of the International Test Conference*, 1991, Paper 9.3, pp. 256–262.
A. Hou et al., "Picosecond Electrical Sampling Using a Scanning Force Microscope," *Electronics Letters*, vol. 28, No. 25, Dec. 3, 1992, pp. 2302–2303.
A. Campbell et al., "Internal Current Probing of Integrated Circuits Using Magnetic Force Microscopy," *31st Annual Proceedings Reliability Physics 1993, pp. 168–177*.
D. Bloom, "Voltage–Contrast Scanning Probe Microscopy," *Proceedings of the –th European Conference on Electron and Optical Beam Testing of Integrated Circuits*, Sep. 1–3, 1993, pp. 1–7.
A. Campbell et al., "Magnetic Force Microscopy/Current Contrast Imaging: A New Technique For Internal Current Probing of ICs," *Proceedings of the 4th European Conference on Electron and Optical Beam Testing of Integrated Circuits, Sept. 1–3, 1993*.
H. Goldstein, *Classical Mechanics*, 2nd ed., Addison–Wesley Publishing Co., ch. 6, pp. 263–265.
M. Levi, "CMOS Is Most Testable", *Proceedings of the IEEE Test Conference*, Paper 9.3, 1981, pp. 217–220.
Y. Martin et al, "Magnetic Imaging By ∂Force Microscopy [With 1000 A Resolution]", *Applied Physics Letters*, vol. 50, No. 20, May 18, 1987. pp. 1455–1457.

(List continued on next page.)

*Primary Examiner*—Kenneth A. Wieder
*Assistant Examiner*—Kourosh Cyrus Khosravi
*Attorney, Agent, or Firm*—George H. Libman

[57] ABSTRACT

A magnetic force microscopy method and improved magnetic tip for detecting and quantifying internal magnetic fields resulting from current of integrated circuits. Detection of the current is used for failure analysis, design verification, and model validation. The interaction of the current on the integrated chip with a magnetic field can be detected using a cantilevered magnetic tip. Enhanced sensitivity for both ac and dc current and voltage detection is achieved with voltage by an ac coupling or a heterodyne technique. The techniques can be used to extract information from analog circuits.

29 Claims, 9 Drawing Sheets

OTHER PUBLICATIONS

Y. Martin et al., "High–Resolution Magnetic Imaging of Domains in TbFe By Force Microscopy," *Applied Physics Letters,* vol. 52, No. 3, Jan. 18, 1988, pp. 244–246.

H. Mamin et al., "Force Microscopy of Mignetization Patterns in Longitudinal Recording Media," *Oct. 17, 1988, pp. 1563–1565.*

D. Halliday et al., *Fundamentals of Physics,* 3rd. Ed. Extended, 1988, Chapter 31, pp. 714–717.

H. Wickramasinghe, "Scanned–Probe Microscopes," *Scientific American,* Oct. 1989, pp. 98–105.

P. Hobbs et al., "Magnetic Force Microscopy With 25 nm Resolution," *Applied Physics Letters,* vol. 55, No. 22, Nov. 27, 1989, pp. 2357–2359.

U. Hartmann, "Theory of Magnetic Force Microscopy," *Journal of Vacuum Science and Technology A,* vol. 8, No. 1, Jan/Feb 1990, pp. 411–415.

Fig. 1

(Prior Art)

MAGNETIC FORCE MICROSCOPY METHOD AND APPARATUS TO DETECT AND IMAGE CURRENTS IN INTEGRATED CIRCUITS

RIGHTS OF THE GOVERNMENT

The United States Government has rights in this invention pursuant to Contract No. DE-AC04-76DP00789 between the U.S. Department of Energy and American Telephone and Telegraph Company and Contract No. DE-AC04-94AL85000 between the Department of Energy and Sandia Corporation.

BACKGROUND OF THE INVENTION

This invention relates generally to the field of failure analysis of integrated circuits, and more particularly, this invention relates to the detection and imaging of internal magnetic fields surrounding currents within operating integrated circuits. Because integrated circuits (ICs) are the key components for nearly all technological systems, design verification, model validation, and analysis of failures of ICs are necessary to ensure their quality and reliability. Complete and detailed IC analysis requires that internal conductor voltages and currents be determined during operation. But, as ICs have become more complex and the sizes of features on the ICs continue to shrink to sub-micrometer dimensions, these tasks have become increasingly difficult. Although techniques for voltage measurement on IC conductors have been available for some time, no practical techniques exist to determine IC currents. Detecting current magnitude, direction or phase, and waveform in ICs is especially desirable to verify design, to analyze analog circuits wherein the currents carry information, and to analyze IC failures when the only signature of failure is anomalous current with no other detectable attribute. Development of a sensitive, non-invasive method to determine currents in internal conductors on ICs is a critical enabling technology for next-generation IC analysis.

Previously, current in IC conductors has been measured by mechanical probing of devices or by inferring the presence of current from liquid crystal or light emission experiments. The electrical probing technique, however, is destructive and inaccurate because of contact resistance effects. Moreover, liquid-crystal and light-emission techniques provide only qualitative data. The first attempt to noninvasively detect current in ICs was done by Helmreich et al. in 1991 who used asymmetric secondary electron emission around current-carrying conductors in a scanning electron microscope and detected 100 mA ac currents on IC test structures. However, low sensitivity and voltage-contrast effects limit the usefulness of this technique.

Magnetic force microscopy is one of several scanning probe microscopy (SPM) techniques. Herein the generic term scanning probe microscopy refers to scanning force microscopy and techniques derived from scanning force microscopy. Samples are imaged in a scanning probe microscope by scanning a sharp probe tip attached to a cantilever close to the sample surface.

A scanning probe microscope has two operating modes: contact and non-contact. In contact mode scanning probe microscopy, the tip is close enough to the surface that a repulsive interaction occurs between the atoms in the tip and in the surface which is detected by monitoring the deflection of the cantilever. A feedback mechanism maintains this repulsive force at a constant magnitude by changing the tip-sample distance. This change develops a topographic image, i.e., a constant force image, of the sample. Piezoelectric elements, capable of producing displacement as small as 0.01 nanometers (nm) are used for positional control of the tip or sample in the x, y, and z directions. Spatial resolution can be achieved on the order of 0.1 nm.

In non-contact mode scanning probe microscopy, the tip is moved 10 nm to 500 nm away from the sample surface, and some spatial resolution is lost in this mode because the tip is farther from the sample surface. Whereas, in the contact mode imaging the atomic repulsive force fields dominate the interaction between tip and sample, in the non-contact mode, the longer-range interactions, such as Van der Waals, magnetic, and electrostatic forces, become important. The sensor or tip must be magnetic in order to interact with the field of interest, i.e., to detect magnetic field gradients. The scanning probe microscopy image is a composite of the effects of all forces acting on the tip. In the absence of other field gradients, long-range Van der Waals forces attract the tip to the sample surface and can be used to generate a topographic image of the surface. Magnetic field gradients can be imaged if the scanning probe microscope tip has sufficient magnetic dipole moment. Depending on the relative strength of the magnetic field and Van der Waals gradients as well as the characteristics of the magnetic tip, the non-contact mode image may show only the magnetic field effects, a superposition of magnetic and topographic effects, or only topography.

In non-contact mode scanning probe microscopy, the tip vibrates perpendicular to the sample surface with an amplitude of approximately 1 nm to prevent attractive forces from drawing the tip into contact with the surface. Tip vibration results from oscillating the cantilever that supports the tip at or near its resonant frequency with an additional piezoelectric element. The local force gradients parallel to the direction of tip vibration ($dF_z/dz$) interact with the vibrating tip and modify the effective spring constant, C, of the cantilever according to $C=C_o+dF_z/dz$, where $C_o$ is the spring constant of the isolated cantilever. If the interaction is attractive, the cantilever will effectively soften, and the resonant frequency will decrease. Conversely, a repulsive interaction will increase the resonant frequency. Changes in the interaction force may be detected by monitoring the amplitude, phase, or frequency of cantilever vibration.

Magnetic force microscopy was developed as a probe to image magnetic fields and domains in magnetic thin films and recording media, and spatial resolution of magnetic features approaching 10 nm have been achieved. Thus, magnetic force microscopy has been shown to be an effective tool to measure small magnetic fields arising from submicrometer scaled features. Three-dimensional simulations and experimental detection of the magnetic field surrounding a current driven single straight conductor were performed by Goddenhenrich et al. in 1990 for purposes of calibrating a magnetic force microscope tip to determine bit structures of data storage media and complete thin-film magnetic devices. But to date, no one has suggested or hinted that the induced magnetic fields from internal currents in integrated circuits can be used to detect and image those currents.

Another non-contact scanning force microscopy technique is charge force microscopy in which electrostatic forces between the tip and sample are measured. Charge force microscopy is used to detect electric fields such as those associated with electrical potentials on conductors. In one variation, the scanning tip is a conductor to which a voltage is applied, i.e., the local electric field gradients exert a force on the conductive tip which is held at a particular voltage. Charge force microscopy has been used to detect and image voltages on IC conductors, and has been used by Hou et al. in 1992 and by Bloom in 1994 to obtain gigahertz waveforms by using a mixing technique. The sensitivity of charge force microscopy is approximately 1 mV. This is as good as, but not an improvement over, the sensitivity of other techniques, principally electron beam techniques, used for detecting voltages and voltage waveforms on operating ICs.

SUMMARY OF THE INVENTION

It is thus an object of the invention to locate current paths and then to localize and measure elevated current paths in integrated circuits for purposes of detecting failures. Such failures could be the result of a design problem, a production problem, or a failure during operation. The feature of the invention which permits this capability is to use a magnetic force microscope which measures the interaction of the induced magnetic field with a magnetized tip of the scanning force microscope. The attractive or repulsive force acting upon the tip can be used to create an image, or map, of the currents in the IC and to detect the relative magnitude and direction of those currents.

It is yet another object of the invention to verify design of, particularly design of analog integrated circuits. The feature of the invention which permits design verification is to view all current paths or a specific current path with scanning magnetic force microscopy to verify current magnitude, direction, and current paths.

It is still another object of the invention to detect relative changes of both ac and dc current during operation of an integrated circuit.

It is an object of the invention to validate models of an integrated circuit in order to measure both voltages at nodes and currents in interconnects within the modeled IC.

It is still another object of the invention to increase the sensitivity of detecting both dc and ac currents in integrated circuits using an ac coupled detection method.

It is still another object of the invention to increase the sensitivity of detecting both dc and ac voltages in integrated circuits using an ac coupled detection method.

These and other objects of the invention are thus achieved as further described in greater detail. The invention described herein demonstrates a new technique called Magnetic Force Microscopy/Current Contrast Imaging that allows sensitive, non-invasive imaging of currents in operating ICs. The magnetic fields associated with current-carrying conductors on ICs are detected and imaged to analyze the magnitude and direction, or phase, of currents in IC conductors with a sensitivity of 1 mA dc and 1 µA ac. This invention represents a significant improvement over the 100 mA ac resolution previously reported using asymmetric secondary electron emission. In addition, this invention also provides for magnetic integrated circuit current imaging as an approach for making a current map of an entire IC. Both current and voltage imaging of internal conductors on operating ICs are now feasible by combining the current contrast imaging techniques with conventional electron-beam voltage contrast techniques already developed and/or charge force microscopy recently developed.

According to this invention, a method to detect internal current of integrated circuits involves positioning an integrated circuit onto a stage of a magnetic force microscope, and then approaching the integrated circuit with a magnetic tip of the magnetic force microscope to within a distance capable of detecting a magnetic field arising from the integrated circuit in a vicinity of interest of said integrated circuit. Power is then applied to the integrated circuit and vibration is applied to the cantilever holding the magnetic tip so that it vibrates at its resonant frequency. To increase system sensitivity, an ac signal, or a dc signal with an ac ripple (where the ac signal or ripple has a frequency equal to the resonant frequency of the cantilever is applied either to the integrated circuit or to the cantilever/tip assembly. The integrated circuit and the tip are scanned relative to each other, and the magnetic forces resulting from current within said integrated circuit are detected and analyzed to obtain current amplitude and direction and generate a magnetic force image of that portion or of the entire integrated circuit. The method is adapted to include an ac signal applied to either the integrated circuit or the cantilever such that the difference between the applied frequency and the frequency of interest in the integrated circuit is a harmonic of the cantilever resonant frequency. These techniques to modify the frequency increases the sensitivity of the method described herein to both currents and voltages in the integrated circuit. The invention herein is further described in reference to the drawings.

DESCRIPTION OF THE INVENTION

Figure 1:
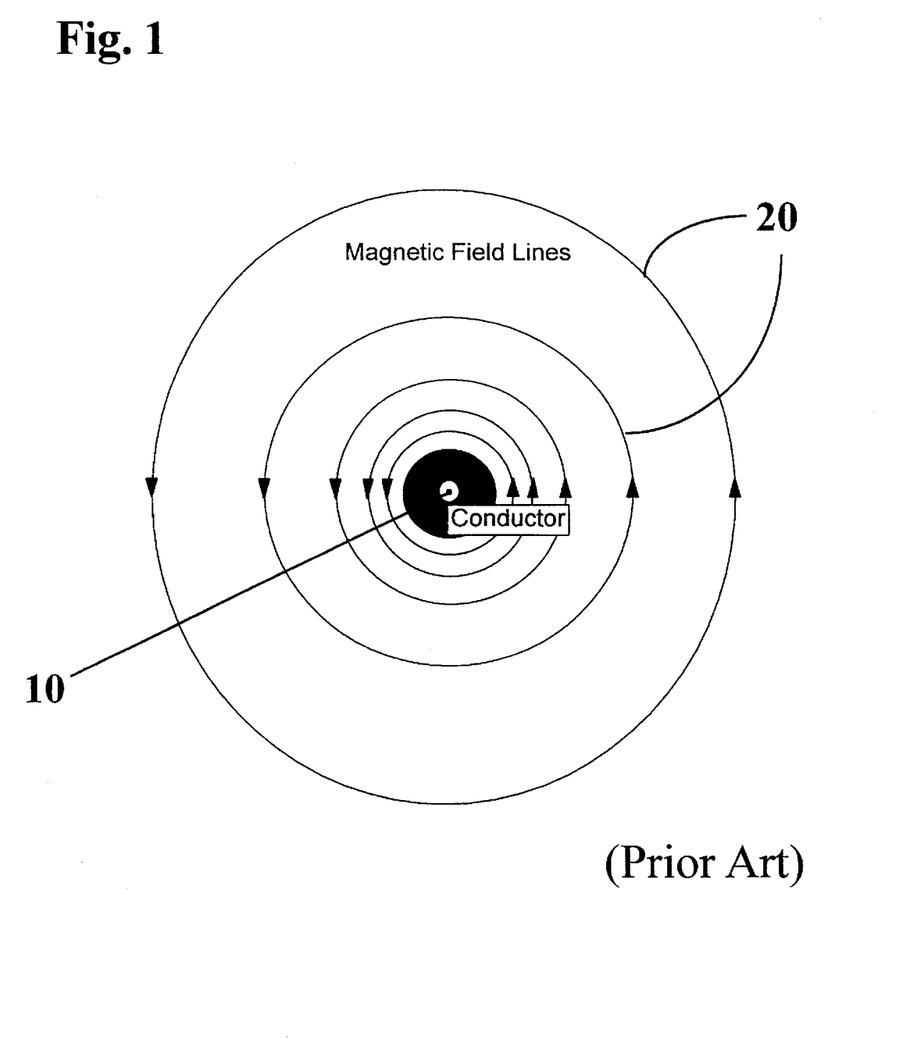
FIG. 1 is a schematic of the magnetic field lines around an isolated current-carrying conductor.

The signature of charge flow in a conductor is the resulting cylindrical magnetic field around the conductor described by Ampere's Law. FIG. 1 is a schematic of the magnetic field lines 20 around an isolated current-carrying conductor 10 with the current direction out of the page. The invention described herein uses magnetic force microscopy to detect and image the very small magnetic fields on ICs associated with internal currents ranging from 1 µA to 20 mA. The magnetic field information is used to map the current paths on the IC. The application of these techniques is not limited to ICs and electronic devices, but could be applied to analyze the currents produced by other small electronic devices, such as inductor coils. These are techniques for detecting and imaging currents in conductors internal to ICs and electronic devices, and the term currents in conductors internal to integrated circuits refers to currents in the small conductors within the circuitry of the devices. This term does not refer to current in the external connections to the IC or device. Reference is also made to Campbell, A. N. et al., "Internal Current Probing of Integrated Circuits Using Magnetic Force Microscopy," 31*st Annual Proceedings Reliability Physics* 1993, pp. 168–177; and to Campbell, A. N. et al., "Magnetic Force Microscopy/Current Contrast Imaging: A New Technique for Internal Current Probing of ICs," to be published in *Microelectronic Engineering* 1994, both of which are hereby incorporated by reference.

Figure 2:
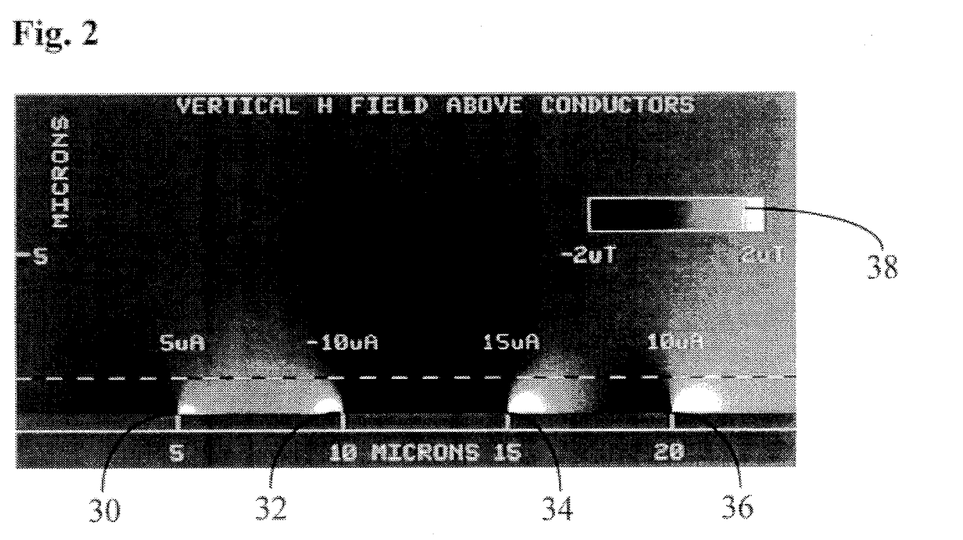
FIG. 2 shows a computer simulated cross-section through four parallel conductors; the magnitude and direction of dc current through each is shown.
Figure 3:
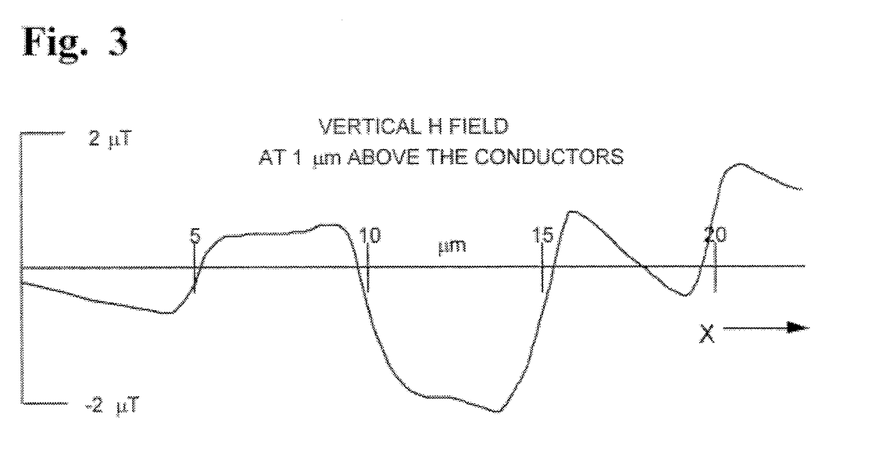
FIG. 3, a computer simulated line-scan, shows the variation of $H_z$ with position (x) at a height of 1 µm above the four conductors shown in FIG. 2.

Prior to implementation of the technique on a scanning force microscope, a simplified two-dimensional computer model was developed to assess the use of magnetic force microscopy for imaging currents in operating ICs. The model calculated the magnetic fields and simulated the magnetic force microscopy image of different currents in several parallel straight conductors assumed to be infinitely thin, infinitely long, and spaced 5 µm apart. The local magnetization was assumed to be zero and the permeability of free space was used for all modeling. FIG. 2 shows a cross-section through the four parallel conductors 30, 32, 34, 36 and the magnetic field around the four conductors which is the superposition of the fields generated around each conductor. The magnitude and direction of dc current through each is shown: for instance conductor 30 has ±5 µA, conductor 32 has −10 µA, conductor 34 has +15 µA and conductor 36 has +10 µA. The background contrast scale 38 of FIG. 2 indicates the magnitude and direction of the vertical component of the magnetic field, $H_z$ to which magnetic force microscopy is most sensitive because the tip vibrates in the z direction. FIG. 3, a line-scan, shows the variation of $H_z$ with position x at a height of 1 µm above the conductors, on the order of microtesla for the simulated currents. Typically, the passivation layer on ICs causes the magnetic force microscope tip to be at least 1 µm above the conductors.

Figure 4:
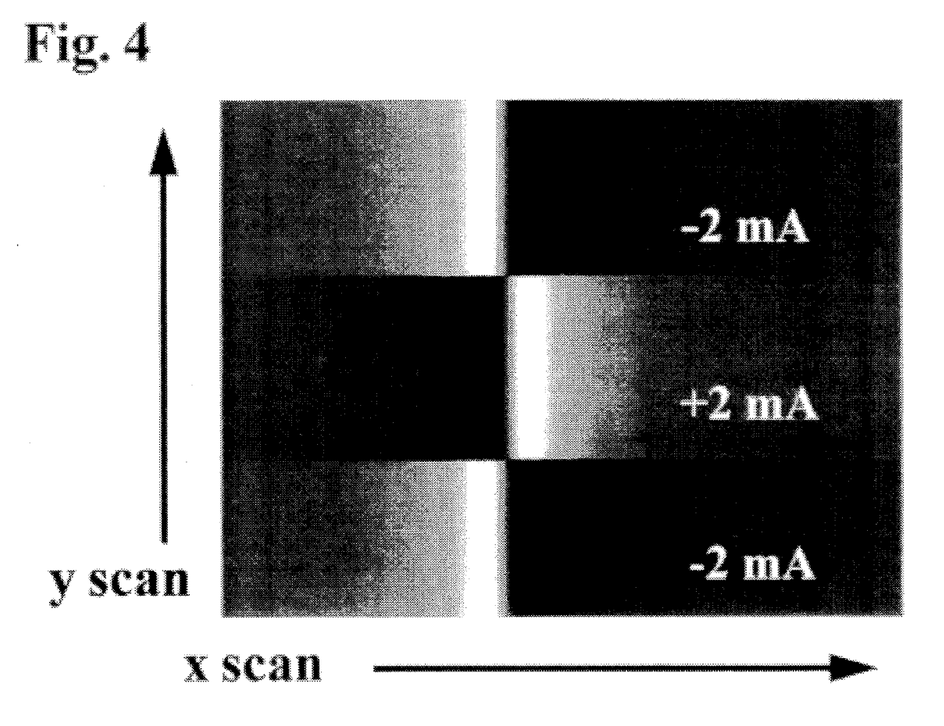
FIG. 4 shows a simulated magnetic force microscope image of single, straight conductor line generated by plotting $dH_z/dz$ as a function of position (x,y) with the tip at a height of 1 µm above the sample.

FIG. 4 shows a simulated magnetic force microscopy image of single, straight conductor line generated by plotting $dH_z/dz$ as a function of position (x,y) with the tip at a height of 1 µm above the sample. The force experienced by the magnetic tip is proportional to $dH_z/dz$, the local magnetic field gradient, and the magnetic force microscopy signal is proportional to the force on the tip. The conductor carried a 2 mA dc current, and the current direction was reversed twice and this is shown on FIG. 4. Beginning at the lower part of FIG. 4, the dc current was initially −2 mA. The bright-to-dark transition in contrast, from left to right in the image, occurs because $H_z$ and $dH_z/dz$ change sign above the conductors as indicated in the line-scan of FIGS. 1 and 3. The y-axis of FIG. 4 indicates both distance along the conductor and time of the raster scan. When the current direction was reversed, the dark-to-bright contrast in the simulated image also reversed.

Figure 5:
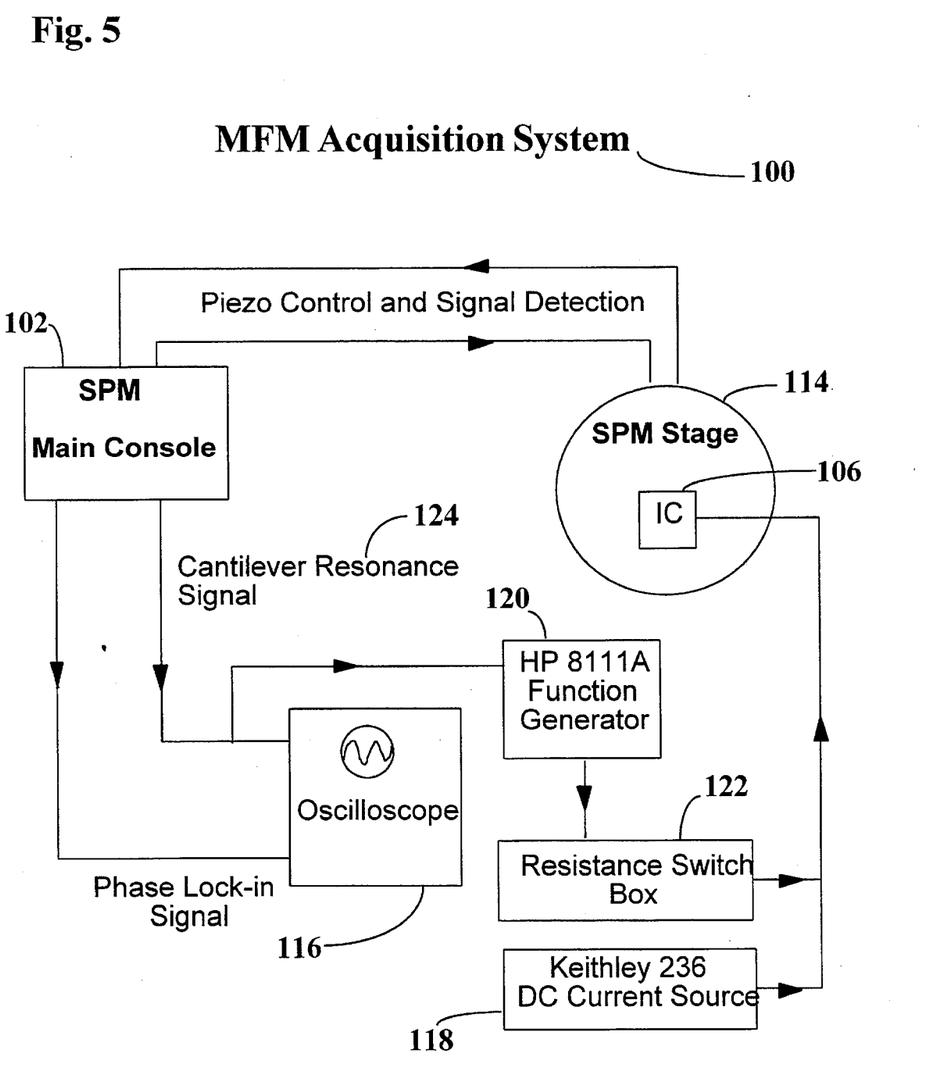
FIG. 5 shows a schematic of the magnetic force microscope acquisition system.
Figure 6:
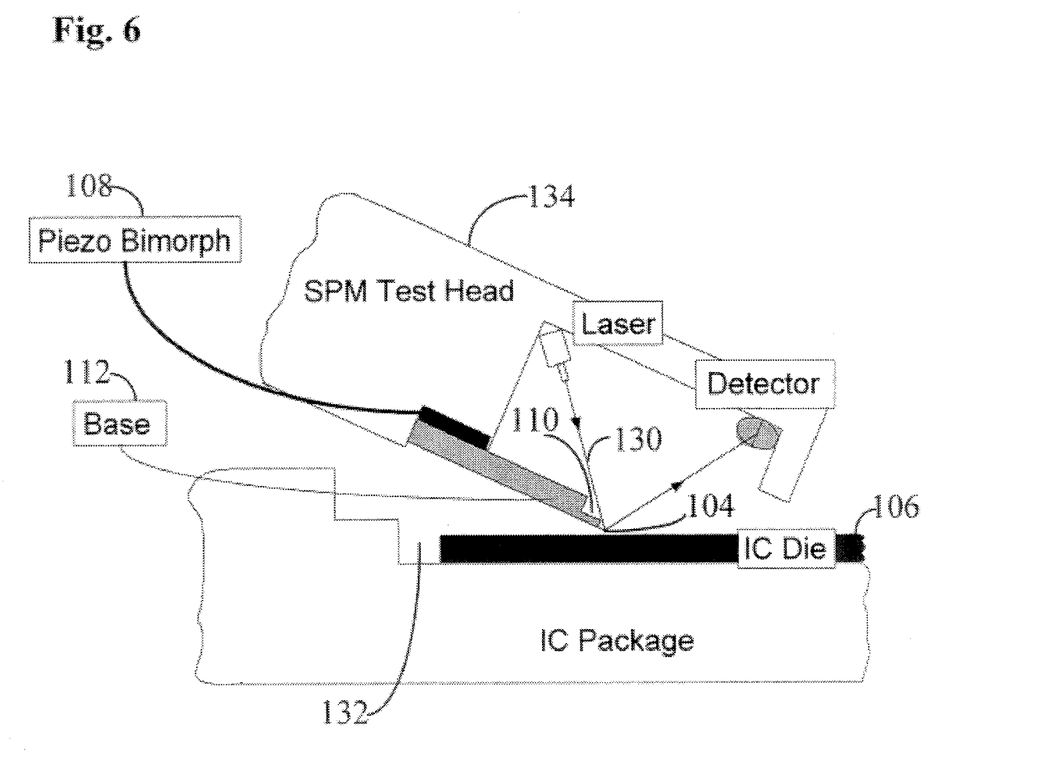
FIG. 6 shows a schematic representation of the scanning probe microscopy test head.
Figure 7:
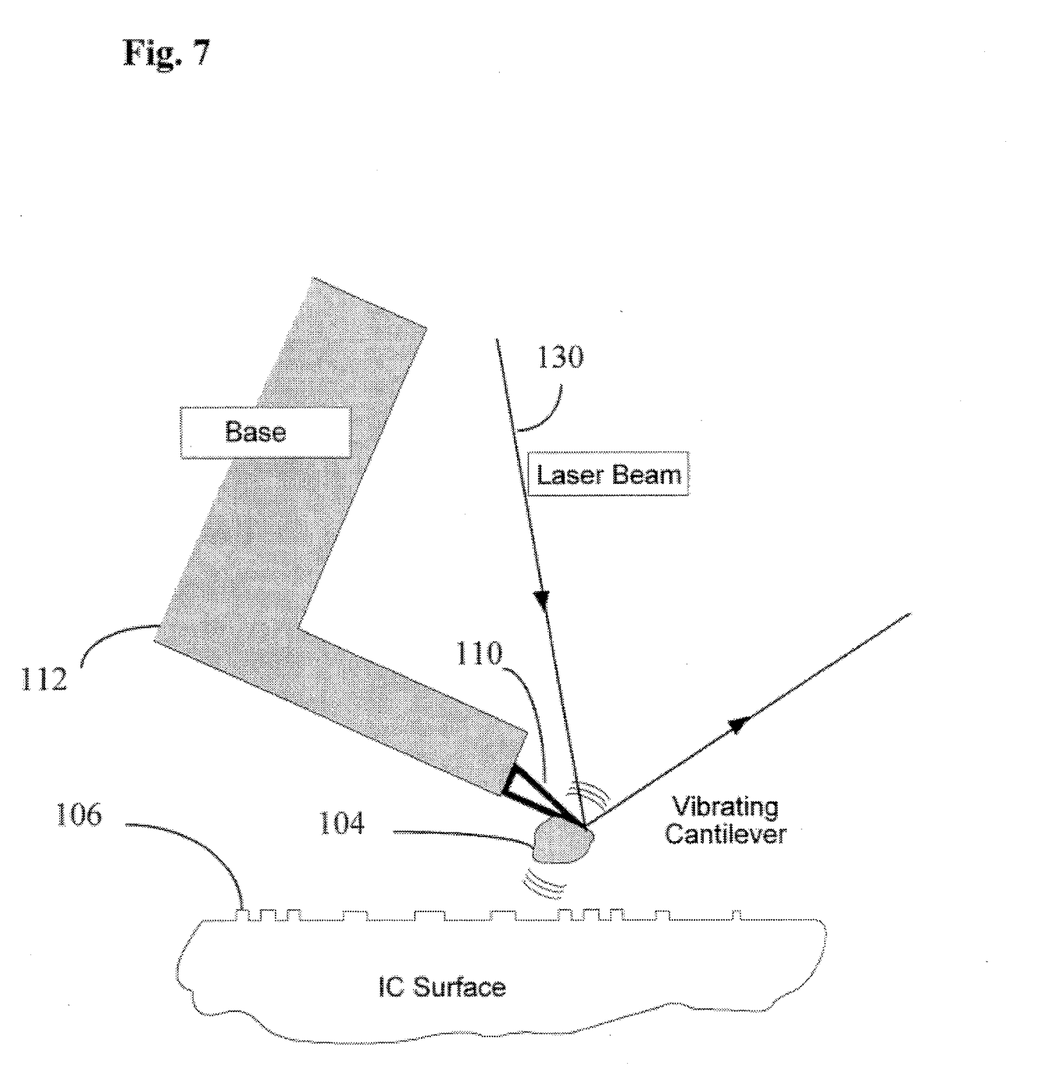
FIG. 7 is a higher magnification schematic view of the cantilever approaching the sample.

FIG. 5 shows a schematic of the magnetic force microscopy acquisition system 100, and should be viewed in conjunction with FIGS. 6 and 7. A Park Scientific Instruments SFM-BD2 scanning probe microscope having a frequency modulation non-contact mode detection module was used to acquire magnetic force microscopy data and images, although the method may also be implemented on other standard magnetic force microscopes with appropriate modifications. The system automatically applies a time varying mechanical vibration at the resonant frequency of the cantilever. The vibration amplitude of the cantilever is held constant but as the tip interacts with magnetic fields on the sample, the changes in vibration frequency are detected. The operating frequency is slightly shifted away from the resonant frequency by a phase acceptance window which is an amount proportional to the operator-selected interaction force between the tip and magnetic fields on the sample. Frequency shifts during operation are continuously monitored by a phase detector. During scanning, a feedback circuit adjusts the tip-sample spacing to maintain a constant force on the tip.

Continuing with reference to FIGS. 5, 6 and 7, the main console 102 controls the fine mechanical approach of the tip 104 to the sample 106 as shown in FIG. 7. The main console 102 also controls the piezoelectric scanning (x, y, and z) of the sample 106, the piezoelectric bimorph 108 that vibrates the cantilever 110 at resonance, the reference frequency, and the phase acceptance window. The cantilever 110 needs to be relatively stiff for implementation of non-contact mode scanning force microscopy, so a reference frequency between 60 kHz and 270 kHz was selected because of the particular scanning probe microscope used. The resonant frequency of the cantilevers with NdFeB magnetic tips attached was experimentally determined to be approximately 22 kHz, a function of the mass of the tip and the geometry and elastic properties of the cantilever. The system 100 was able to sense multiple harmonics of the resonant frequency, so the third harmonic of 66 kHz was used as the reference frequency. The resonant frequency is applied to the cantilever base 112 through the piezoelectric bimorph 108 so that the cantilever 110 vibrates at that frequency. The magnetic tip 104 attached to the cantilever 110 also vibrates at that frequency and interacts with magnetic fields arising from current in the conductors in the sample 106 on the SPM stage 114. Both the cantilever resonant signal and the user-selected reference signal are displayed on an oscilloscope 116.

Because the particular scanning probe microscope used, the PSI SFM-BD2, was operated in a manner for which it was not designed, the procedure for scanning and imaging had to be somewhat modified. Locking onto the third harmonic of the cantilever resonance increased the system response time, which helped prevent the tip 104 from crashing into the surface of the sample 106. The system's gain, force, and time constant settings were adjusted for operation at the harmonic reference frequency. First, the gain was significantly increased to increase system response, and the time constant of the feedback loop controlling the vertical position of the tip with respect to the sample was slightly increased which somewhat offset the high gain effects but mitigated crashing. Tip crashes still occurred occasionally when operating on the third harmonic, but not as persistently as when operating at the first harmonic. The force between the tip 104 and the sample 106 was also adjusted according to tip and sampling conditions to minimize tip crashing. Scan rates were decreased to compensate for the large decrease in bandwidth resulting from other modifications to the operating system conditions, and because the scan rate influences the spatial resolution of the images, greater resolution of the image was obtained from the slower rate.

For quantitative measurement of relative changes in current levels, the tip was parked about 10 μm laterally away from the test conductor. The track function on the scanning probe microscope, which can be thought of as an ac/dc coupler, was switched to the hold mode for purposes of calibration. The track mode was not chosen because then the output would sense only relative differences in signal as the image is scanned. If there were no changes in the signal, there would be no responses from the system. However, in the hold mode, dc forces produce a constant signal for as long as they are applied. Thus, hold mode was selected rather than the track mode.

Magnetic force microscopy current contrast images were obtained with both dc and ac stimuli. DC stimulus results in static magnetic field gradients around the conductor. These gradients are detected readily by non-contact mode imaging. The magnetic field gradients associated with ac current can be detected also when the ac signal is synchronized with cantilever vibration. A vibrating cantilever can be treated mathematically as a simple harmonic oscillator. The vibration amplitude, A, of a simple harmonic oscillator with an external force applied at $\omega_1$ can be expressed as:

$$A \propto 1/(\omega_0^2 - \omega_1^2)$$

where $\omega_0$ is the oscillator resonant frequency. As $\omega_1$ approaches $\omega_0$, the amplitude of vibration increases rapidly. In practice, this means the magnetic force microscopy signal sensitivity increases dramatically if the ac signal is applied to the conductor at $\omega_0$. In actual practice, dc power supplies are used to bias ICs. However, by applying a small ac ripple of a few percent, for example, of tens of millivolts at the cantilever resonant frequency to the dc power supply, it is possible to take advantage of the resulting increased sensitivity for normally operating ICs.

Electrical stimulation of the IC was performed with both dc and ac currents. Shown in FIG. 5, a Keithley 236 source measurement unit 118 provided dc stimulation of the IC. An HP 8111A function generator 120 provided ac stimulation. A variable resistance switch box 122 selected ac current through the IC. The cantilever response signal, which is monitored continuously from the reflected laser beam 130 off the back of the cantilever 110, was used to trigger the function generator 120 to ensure synchronization of the ac signal with cantilever vibration.

FIG. 7 is a higher magnification schematic view of the cantilever 110 approaching the surface of the IC sample 106. The micromachined cantilever 110 and its tip 104 are much smaller than the cantilever base 112, which may be made from Pyrex, attached to the scanning probe microscope test head 134 as viewed in FIG. 6. As shown, the tip 104 of the magnetic sensor used in the original experiment is relatively large compared to the minimum feature size on the IC 106. The large tip size limits the spatial resolution to some degree.

Implementation of magnetic force microscopy for current contrast imaging required that the tip or force sensor be modified. The force sensor is a very important part of any scanning force microscope. The commercial scanning probe microscopes typically use micromachined silicon nitride ($Si_3N_4$) or silicon cantilevers with integrated tips as the force sensor. To perform magnetic force microscopy, a magnetic probe tip is required. Some work has been done to develop magnetic thin film coatings that can be applied to the micromachined cantilevers used with the commercial scanning probe microscopes. Attempts to use micromachined $Si_3N_4$ tips, coated with a Co—Cr based alloy having a thickness of 20 nm to 40 nm were undertaken but were unsuccessful.

Figure 8A:
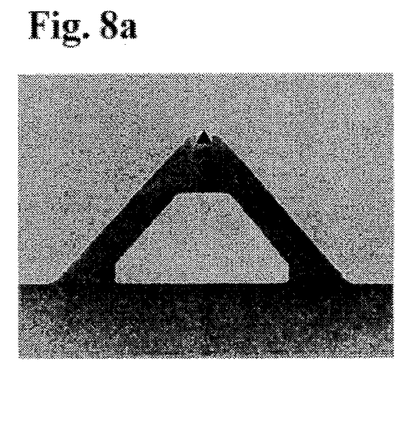
FIG. 8a shows a micromachined cantilever with an integrated pyramidal tip and FIG. 8b shows the cantilever with a magnetic filing attached.
Figure 8B:
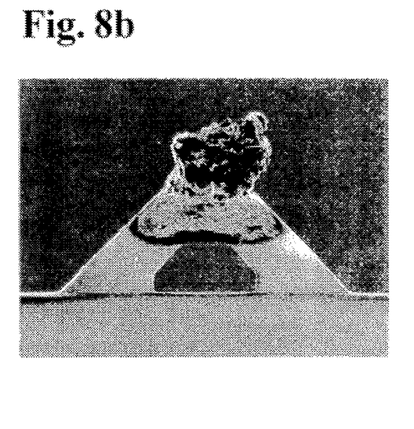

Magnetic tips were fabricated, however, by attaching small, approximately 20 μm to 50 μm, filings from a commercially available rare earth, NdFeB, permanent magnet to the micro-machined $Si_3N_4$ cantilevers. FIG. 8a is a scanning electron micrograph of a micromachined cantilever with an integrated pyramidal tip, and FIG. 8b shows a cantilever with a magnetic filing attached. A cyanoacrylate adhesive was used to attach the magnetic filings to the cantilever. A microprobe station was used to place a cyanoacrylate droplet and a magnetic filing on each cantilever. The magnetization of the tip must be perpendicular to the plane of the cantilever base, and parallel to the direction of tip vibration, thus the geometry of the tips influences the spatial resolution of the technique. A relatively high net tip magnetization and coercivity are needed to detect the very small magnetic fields on the order of millitesla associated with dc current in ICs. High coercivity means that the magnetization remains when the external field used to magnetize the material is removed. Tip magnetization increases as tip size increases. However, it is desirable to minimize the size of the magnetic tip to improve the spatial resolution of the technique.

Figure 9:
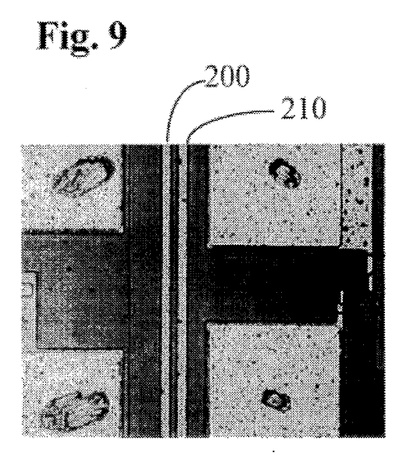
FIG. 9 is an optical micrograph of the test structure for dc and ac analysis. The two aluminum conductors shown are 4 µm wide.

FIG. 9 is an optical micrograph of a passivated test structure for dc and ac analysis showing two aluminum conductors 200 and 210, each 4 μm wide running vertically between four bond pads. Current is passed through the conductor 210. The conductor on the left 200 is electrically floating for all measurements and images. For optimum signal strength and spatial resolution, the gain of the z-piezoelectric drive was maximized and the scan speed minimized. The scan speed of 15 minutes per image ensured that the scanning probe microscope could respond to the magnetic forces encountered during the raster scan before the cantilever had moved from the source of those forces.

Figure 10:
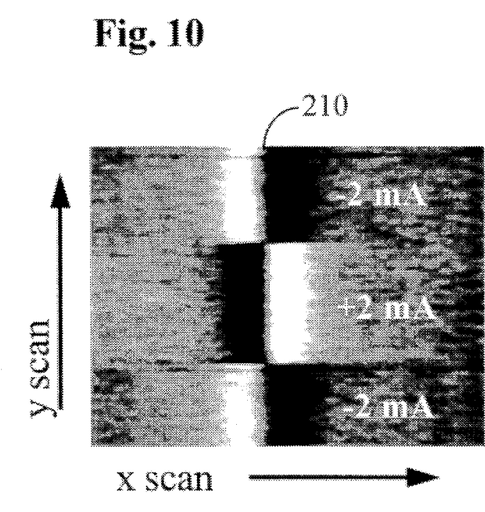
FIG. 10 is a magnetic force microscopy image of the passivated test structure shown in FIG. 9 with ±2 mA dc current in the conductor.

FIG. 10 is a magnetic force microscopy image of the passivated test structure shown in FIG. 9 with ±2 mA dc current in the conductor 210. No differences in current or spatial resolution were observed with the passivation removed. The current was initially −2 mA, and the corresponding magnetic force microscopy image is seen in the bottom third of FIG. 10. The current direction was reversed during acquisition of the image. The middle section of the image displays the vertical magnetic field gradients when the applied current is +2 mA, and at the top of the image the current is again −2 mA. The conductor 210 is located at the bright/dark-dark/bright interface in the middle of the image. Note that this is very similar to the modeled magnetic force microscopy image shown in FIG. 4. Images similar to FIG. 11 were obtained for applied dc currents of ±500 μA and ±250 μA. The magnetic force microscopy signal is proportional to the applied current; thus, the signal-to-noise ratio worsens as the current magnitude decreases, but the detection limit will vary with applied current and with tip structure.

Figure 11:
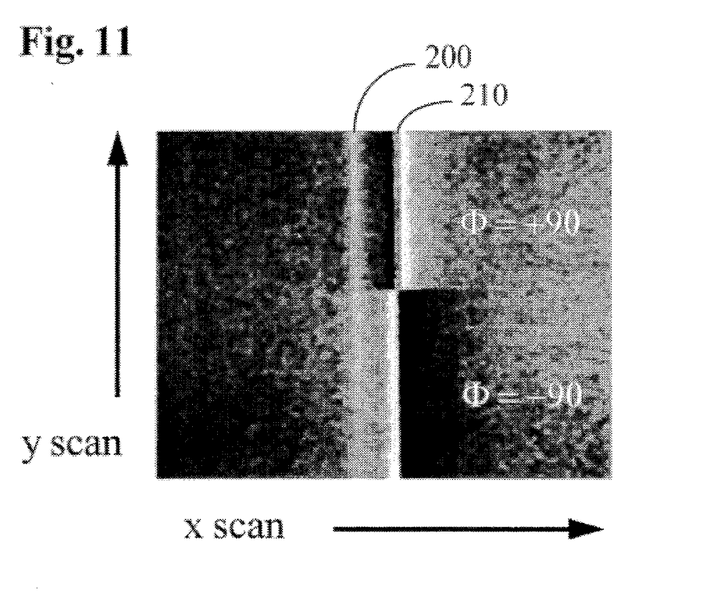
FIG. 11 shows the magnetic force microscopy image of a 20 µA peak-to-peak current through the conductor.

Large increases in current and magnetic field sensitivity can be achieved by varying the current through the conductor at the resonant frequency of the cantilever. FIG. 11 shows the magnetic force microscope image of a 20 µA peak-to-peak AC square wave current through the conductor 210 of FIG. 9. Halfway through acquisition of the image, the phase of the ac current was changed by 180° causing the bright/dark contrast to reverse. The increase in sensitivity was so great that smaller magnetic tips with a reduced net magnetic dipole moment are adequate for ac analysis as shown here. The use of a physically smaller tip increased the spatial resolution to the point that the topology of the unbiased conductor on the left 200 is now visible as a Van der Waals force image superimposed on the magnetic force image. This ac coupling technique can be modified slightly so that large increases in voltage and electric field sensitivity can also be achieved by applying a time varying voltage to the integrated circuit.

Figure 12:
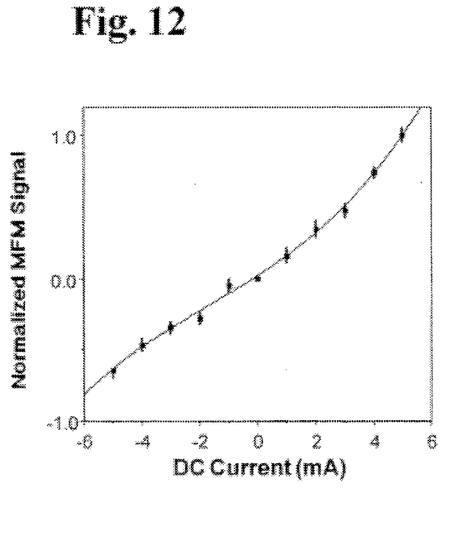
FIG. 12 shows a plot of normalized magnetic force microscopy signal response to applied dc current.

By parking the magnetic force microscopy cantilever approximately 10 µm laterally from the conductor and monitoring the change in magnetic force microscope signal with applied current, the sensitivity of magnetic force microscopy to differences in applied current was demonstrated. FIG. 12 shows a plot of normalized magnetic force microscope signal response to applied dc current. Zero (0) magnetic force microscope signal at zero (0) current has been added arbitrarily as a data point in FIG. 12 with no error bars. These data indicate that a change of approximately 1 mA over the ±5 mA range is easily detected. A best-fit, third-order polynomial fit to the data is displayed in FIG. 12. The exact shape of the curve depends on the effect of external force gradients on cantilever resonant properties, as well as the magnetic force microscopy system response over the signal range.

Figure 13:
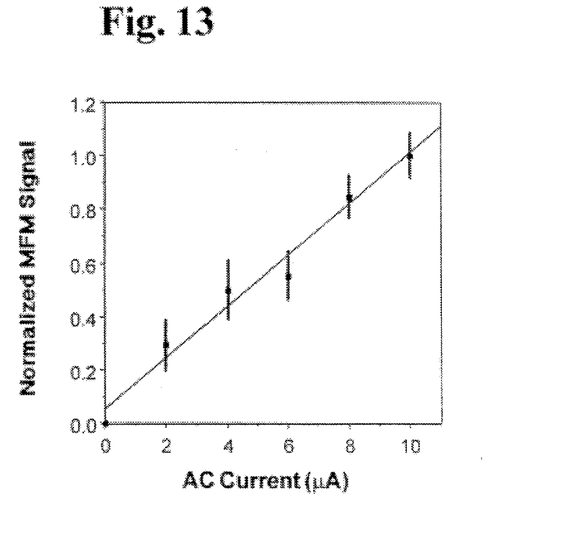
FIG. 13 shows the magnetic force microscopy signal response to ac currents.
Figure 14:
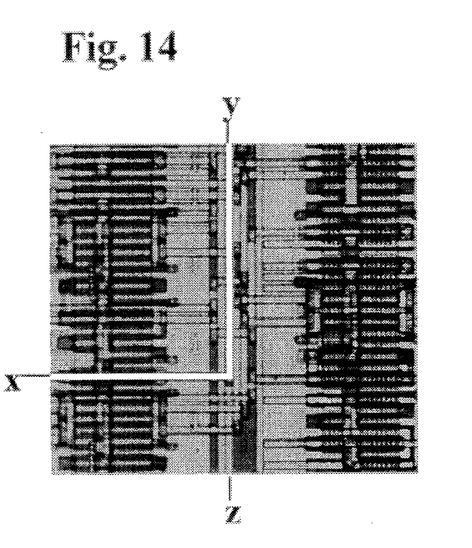
FIG. 14 is an optical micrograph of an integrated circuit showing a current path in white.

FIG. 13 shows the magnetic force microscopy signal response to ac currents. These data were also acquired by parking the cantilever and acquiring the magnetic force microscopy response versus applied ac current. The data in FIG. 13 indicate that shifts of approximately 1 µA can be detected over this 20 µA peak-to-peak ac range. FIGS. 13 and 14 show that changes in current magnitude as small as 1 mA dc and 1 µA peak-to-peak ac can be detected. The lateral parking distance from the conductor, the vertical distance above the IC surface, the reference frequency and phase acceptance window, as well as the particular cantilever, all contribute to the magnetic force microscope response to different currents, i.e., magnetic fields.

Figure 15:
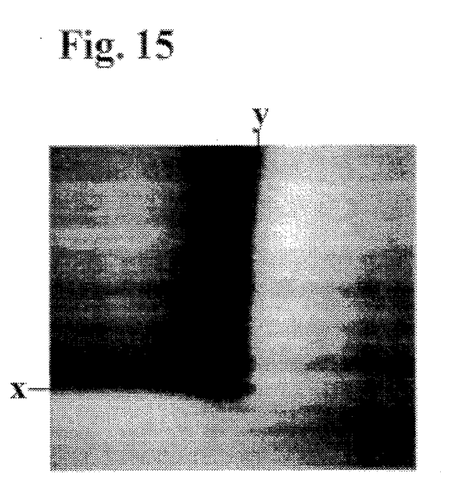
FIG. 15 is a dc magnetic force microscopy/current contrast imaging image of the elevated current path on the damaged IC.

FIG. 14 is an optical micrograph of a damaged IC and FIG. 15 is the dc magnetic force microscopy/current contrast image of the elevated current path on the damaged IC. The IC has two levels of metal interconnect, 1.25 µm metal-1 and 1.75 µm metal-2. A metal-1 to metal-2 short was produced by using a laser to fuse a metal-2 signal conductor to a metal-1 $V_{DD}$ power bus. The IC drew 10 mA dc current with 3.3 V applied bias. Most of this current was a result of the laser-induced short circuit; the IC current level was <50 µA at 5 V before fusing. Shown in FIGS. 14 and 15, the bright/dark interface that runs horizontally from the lower left (x) to center and then vertically (to y) indicates the conductor location. Even though the current path is a backward L in shape, as shown in FIGS. 14 and 15, the conductor actually has a T shape; the conductor forming the vertical part of the current path continues to the bottom of the image (z) in FIG. 14. Using prior art voltage contrast imaging, electrical continuity was confirmed at this interconnection. This demonstrates that the actual current path can be determined by magnetic force microscopy/current contrast imaging from among multiple possible paths. The same IC was also examined using ac current with similar results. The power supply used to bias the IC under AC conditions had a dc voltage of 3.225 V with a superimposed ac ripple of 0.075 V.

Scan size is an important consideration of IC analysis because the user typically wants to quickly examine an entire IC, wafer, or multichip module to identify currents and current paths. A limitation of the piezoelectric scanners used in SPM is that the largest area that can be scanned in a single image is approximately 250 µm×250 µm. One methodology to scan larger areas requires a large-area precision mechanical translation stage, as for example, an optically encoded stage having at least several inches of translation capability which would be integrated into the system and allow the sample to be repositioned with submicrometer accuracy. Two approaches are possible. The first approach is to take a series of 250 µm×250 µm scans, which could then be taken and be processed or combined into a mosaic, creating an image of a field of view larger than 250 µm by 250 µm. The second approach would use a precision translation stage to translate a sample in the x and y directions and scan the entire IC or area of interest in a single scan. This latter option is referred to as magnetic integrated circuit current imaging. While the spatial resolution is reduced relative to magnetic force microscopy, this technique will allow rapid magnetic imaging of an entire sample, as for instance, the detection of anomalous currents on the chip. The mechanical scanning stage for a system optimized to perform magnetic integrated circuit current imaging requires a relatively fast scan rate and the ability to compensate for sample surfaces that are not perfectly level. Thus in one instance, the probe tip was stationary and the sample stage was modified to allow for translation of dimensions not generally used in magnetic force microscopy. In other applications, however, the sample stage may be held stationary and the magnetic tip moved with respect to the sample.

In addition to the ability to scan large areas, a scanning probe microscopy system for IC analysis accommodates not only packaged ICs, wafers, and multichip modules, but also the fixtures, probe cards, and electrical interconnections that bias and test the devices. Such fixtures may be mounted on the large-area translation stage which may be used for other types of non-contact mode imaging of ICs, including charge force microscopy.

Alternatively, or in addition to the translation capability, a system with both coarse and fine viewing options is also envisioned herein. The coarse mode reduces spatial resolution and scans the entire sample quickly to develop an overall current map of the IC. This coarse-viewing mode is implemented by using the mechanical translation stage to scan the sample in x and y directions, while the scanning probe microscope electronics detect changes in magnetic force between the tip and sample in the z direction. The x and y translation capability of the piezoelectric tube scanner, to which the tip or sample is mounted, is not typically used for coarse viewing. When performing fine viewing, the system operates in the normal scanning probe microscopy mode, with the piezoelectric tube scanner used to scan the tip or sample in x and y directions while maintaining a constant force between the tip and sample in the z direction. Because the scan rate is quicker and the tip sample distance may be greater in the coarse mode, a system having two tips is also embodied herein. A tip with a larger magnetic dipole moment than used for fine imaging is used for the coarse mode imaging. Fine viewing uses a magnetic tip having a different size, magnetic dipole, geometry, and magnetic domain structure, such as the thin-film tip, for better spatial resolution.

Two aspects of using ac signal coupling to improve the magnetic field and the electric field sensitivity were previously discussed. The first is to increase the imaging sensitivity by applying an ac current or ac voltage at a harmonic of the cantilever resonant frequency to the measured signal line. The second technique is to apply the ac current or the ac voltage at a harmonic of the cantilever resonant frequency to the cantilever and tip itself through a solenoid surrounding the cantilever. This produces a force at the cantilever resonant frequency on the tip and in this way the cantilever behaves as a driven harmonic oscillator yielding increased response to both current and voltages. When an oscillating voltage is applied to the base of a conducting cantilever/tip arrangement or to the integrated circuit, the magnetic force microscope functions as a charge force microscope and voltages can be mapped on the integrated circuit.

Figure 16:
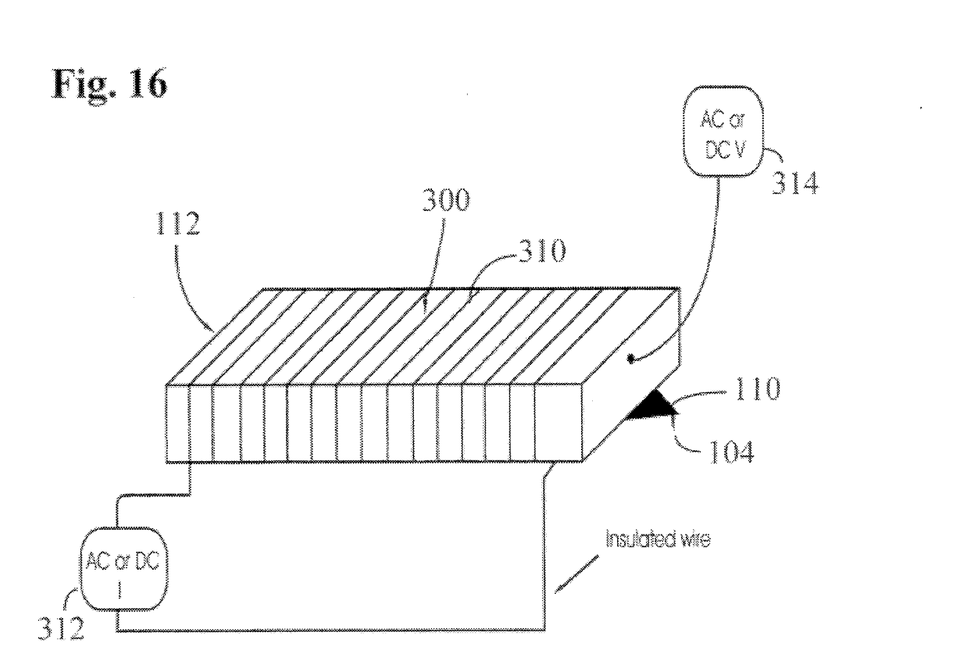
FIG. 16 is a diagram of the improved microscope tip of the invention for enhanced sensitivity to both magnetic and electric fields.

To increase sensitivity, the tip magnetization is varied at the cantilever resonant frequency. The sensor may be constructed to produce a variable magnetic force between the tip and sample to increase scanning probe microscopy sensitivity to lower dc forces with ac resonant sensitivities, FIG. 16 illustrates this approach to produce magnetic tips with micromachined cantilevers. The base 112 and cantilever 110 are coated with a magnetic and conductive material 300, such as Fe, Co, Ni, or a Co—Cr based alloy. The base 112 is wrapped with a solenoid coil 310. The optimum magnetic coating thickness is determined experimentally, but thick coatings may be required to obtain sufficient magnetization. An ac or dc signal 312 can be applied to the coil 310 to produce ac or dc magnetization on the tip 104, perpendicular to the plane of the cantilever base 112 and to the sample surface. By applying an ac signal at the cantilever resonant frequency, an amplification of the magnetic force microscopy response by several orders of magnitude occurs. By varying the frequency and/or magnitude of an applied voltage 314 at the cantilever resonant frequency, the electric field sensitivity increases, and in this fashion, the instrument functions as a charge force microscope. In addition, applying a small ac ripple to the dc power supply to the sample under test also increases the sensitivity of the charge force microscopy techniques. The thin film coated tips have much higher aspect ratios than those fabricated from NdFeB magnetic filings and allow imaging with much better spatial resolution, because of the sharper tip and because of closer approach to the sample without crashing. The resonant frequency of these thin film tips is considerably higher by a factor of 3 to 10, depending on the type of cantilever used, which leads to a corresponding increase in the signal-to-noise of the magnetic force microscopy response.

It is also possible to sense currents and voltages at frequencies other than the cantilever resonant frequency which detects time variation of current and/or voltage waveforms, which in turn provides greater detailed information on the internal functioning of the IC. If the difference between the frequency of the phenomenon to be observed, i.e., the IC current or IC voltage, and the frequency of the electrical field or magnetic field applied to the cantilever/tip is equal to the cantilever resonant frequency, then the driven harmonic oscillator amplification is achieved. In this way, a heterodyne force is introduced at resonance of the cantilever which not only increases the sensitivity of detecting both voltages and currents in the integrated circuit, but also increases the bandwidth of current detection capability. The magnetic inductance will limit how fast the solenoid and the resultant magnetization can be switched from one magnetic polarity to another. Switching rate is not expected to be a limitation in charge force microscopy; in fact, gigahertz signals can be analyzed by this type of mixing technique.

There is, however, an over-sensitivity when detecting higher ac signals at the cantilever resonant frequency. Though differences between 2 µA and 20 µA ac could be detected, the difference between 20 µA and 1 mA ac could not be detected because the higher currents saturated the response of the scanning probe microscopy system. Four options exist to compensate for this saturation and to provide for detection of higher currents: first, a tip design of FIG. 16 allows the amplitude of the driving current through the solenoid to be adjusted, allowing for the net tip magnetization which in turn permits the system response to be varied. Second, the frequency of the solenoid could be varied slightly off the resonant frequency to reduce the driven harmonic oscillator effect. Third, the waveform of the signal driving the ac solenoid current could be varied, for instance a sine wave matches the vibration characteristics of the cantilever more closely. Fourth, the phase of the ac source could be varied to minimize or maximize the harmonic force generated. A combination of all four factors may be necessary to achieve optimum results, and the last three techniques are also achieved using the ac ripple technique discussed previously. By using this approach, different sensitivity ranges, similar to the effect of a gain switch, are realized in sensing both dc and ac currents in an IC.

The invention has thus been described as a method for detecting internal currents and voltages and quantifying changes in internal current and voltages of integrated circuits. The invention also embodies the use of a modified magnetic tip on the cantilever as described to include one having a greater magnetic dipole moment to detect larger dc currents, and one with a lesser magnetic dipole moment, including magnetic thin films, to detect ac currents. Several ac coupling enhancements have also been described as applying either a current or voltage oscillating at the cantilever's resonant frequency to either the cantilever/tip arrangement or to a specific conductor or node greatly enhances the method's sensitivity to dc and ac current and voltages. Moreover, if the difference between the frequency at the cantilever/tip and the frequency within the integrated circuit is a harmonic of the cantilever resonant frequency, increased sensitivity is also obtained. A modified magnetic tip having a wrapped solenoid has also been invented which enables the magnetic and the electric field at the cantilever/tip to oscillate at varying frequencies. The invention further embodies a large scale translation stage so that entire chips or modules can be scanned with relative speed and ease. The system, furthermore, may include a coarse and a fine resolution capability in order to detect, map and quantify the currents based on the magnetic force microscopy/current contrast image obtained. Thus, the present invention and many of its attendant features and advantages will be understood from the description, and it is apparent that changes may be made in the form, construction, and arrangement thereof without departing from spirit and scope of the invention or sacrificing its material advantages.

What is claimed is:

1. A method to non-invasively and nondestructively detect internal current in integrated circuits having internal conductive paths and a top surface, said method comprising the steps of:

(a) positioning an integrated circuit onto a stage of an apparatus having a magnetic tip attached to a cantilever, said cantilever having a base and a resonant frequency;

(b) applying an electrical signal to said integrated circuit to produce magnetic fields from the conductive paths:

(c) approaching said integrated circuit with said magnetic tip of said apparatus to within a distance from said top surface of said integrated circuit small enough for a magnetic interaction to occur between said magnetic tip and the magnetic fields from said internal conductive paths and large enough that said magnetic tip does not physically interact with said top surface of said integrated circuit;

(d) vibrating said cantilever at its resonant frequency;

(e) scanning said integrated circuit and said magnetic tip relative to each other;

(f) detecting changes in the resonance properties of said cantilever caused by interactions in the magnetic forces between said conductive paths and said magnetic tip and determining current paths, magnitudes, and direction in said conductive paths from said changes in the resonance properties of said cantilever; and (g) generating a map of said current in said integrated circuit.

2. The method of claim 1, further comprising applying a time varying magnetic dipole moment to said magnetic tip at a first frequency, wherein the first frequency is at about an harmonic of said cantilever resonant frequency.

3. The method of claim 2 wherein a time varying current is applied to a solenoid winding around said base to induce a time varying magnetic dipole moment in the magnetic tip to enhance detection sensitivity to said current in said conductive paths.

4. A method to non-invasively and nondestructively detect internal currents in integrated circuits having internal conductive paths and a top surface, said method comprising the steps of:

(a) positioning an integrated circuit onto a stage of a scanning probe microscope having a magnetic tip attached to a cantilever having a resonant frequency;

(b) applying an electrical signal to said integrated circuit to induce magnetic fields from said currents in the conductive paths, the electrical signal having an ac component at about the resonant frequency of the cantilever and a dc component;

(c) approaching said integrated circuit with a magnetic tip of said scanning probe microscope to within a distance from said top surface of said integrated circuit, wherein said distance is small enough for a magnetic interaction to occur between said magnetic tip and said magnetic fields from said currents in said conductive paths and large enough that said magnetic tip will not physically interact with said top surface of said integrated circuit;

(d) vibrating said cantilever, wherein said cantilever vibrates at about its resonant frequency;

(e) scanning said integrated circuit and said magnetic tip relative to each other;

(f) detecting changes in the resonance properties of said cantilever caused by interactions in the magnetic forces between said currents in said conductive paths and said magnetic tip and determining current paths, magnitudes, and direction from said changes in the resonance properties of said cantilever; and (g) generating a map of said current in said integrated circuit.

5. The method of claim 1 wherein said step of scanning said integrated circuit further comprises maintaining said magnetic tip stationary and translating said integrated circuit on a translation stage relative to said tip.

6. The method of claim 1 wherein said step of scanning said integrated circuit further comprises maintaining said integrated circuit stationary and moving said magnetic tip relative to said integrated circuit.

7. The method as claimed in claim 1, wherein said cantilever is coated with a magnetically and electrically conductive material.

8. The method as claimed in claim 7, wherein a voltage is applied directly to said conductive material to permit the apparatus to operate as a charge force microscope and to increase the electric field sensitivity of the charge force microscope.

9. The method as claimed in claim 8, wherein said conductive material is selected from the group consisting of iron, cobalt, nickel, and cobalt-chromium alloy.

10. The method as claimed in claim 1, wherein the apparatus is a magnetic force microscopy system.

11. The method as claimed in claim 1, wherein the magnetic tip has a high enough magnetic dipole moment to detect magnetic fields associated with currents in said conductive paths in said integrated circuit.

12. The method as claimed in claim 1, wherein said integrated circuit has a passivation layer over said conductive paths.

13. The method as claimed in claim 1, wherein the detection sensitivity for current in the integrated circuit is at least 1 mA dc and at least 1 µA ac.

14. The method as claimed in claim 1, wherein the electrical signal is a dc voltage.

15. The method as claimed in claim 1, wherein the electrical signal is an ac voltage, wherein said ac voltage is at about the resonant frequency of the cantilever.

16. The method as claimed in claim 14, further comprising applying a time varying current at about the resonance frequency of the cantilever to a solenoid winding around said base which induces a time varying magnetic dipole moment to the magnetic tip to enhance detection sensitivity to said current in said conductive paths.

17. The method as claimed in claim 15, further comprising applying a time varying current at about the resonance frequency of the cantilever to a solenoid winding around said base which induces a time varying magnetic dipole moment to the magnetic tip to enhance detection sensitivity to said current in said conductive paths.

18. The method as claimed in claim 1, wherein the electrical signal has ac component and a dc component and said ac component is at about the resonant frequency of said cantilever, and a time varying magnetic field is applied to a solenoid winding around said cantilever enhancing detection sensitivity to said current in said conductive paths.

19. The method as claimed in claim 18, wherein the ac component of said voltage is a few percent of said dc component of said voltage.

20. The method as claimed in claim 1, further comprising the step of calibrating the detected changes in the resonant properties of said cantilever to the relative current magnitude and direction of the current in said conductive paths.

21. The method as claimed in claim 20, wherein the relative current magnitude and direction of the current in said conductive paths is calibrated with the magnetic tip at a fixed lateral distance from said conductive paths.

22. The method as claimed in claim 4, wherein said integrated circuit has a passivation layer over said conductive paths.

23. The method as claimed in claim 4, wherein the detection sensitivity of current in the integrated circuit is at least 1 mA dc and at least 1 µA ac.

24. The method as claimed in claim 1, wherein the image of said current is displayed for the integrated circuit in a single scan in an x–y plane.

25. The method as claimed in claim 4, wherein the image of said current is displayed for the integrated circuit in a single scan in an x–y plane.

26. The method as claimed in claim 4, wherein the magnetic tip has a high enough magnetic dipole moment to detect magnetic fields associated with currents in said conductive paths in said integrated circuit.

27. The method as claimed in claim 1, wherein the map of said current is a current contrast image and said current contrast image displays information about current path, magnitude and direction.

28. The method as claimed in claim 4, wherein the image of said current is a current contrast image and said current contrast image displays information about said current path, magnitude and direction.

29. The method as claimed in claim 4, further comprising applying an ac signal having a second frequency to said magnetic tip which varies said magnetic tip's magnetic dipole moment and said second frequency is equal to about an harmonic of said resonant frequency of said cantilever.

* * * * *